Feb. 16, 1971 T. N. RAO 3,564,439
DIFFERENTIAL AMPLIFIER
Filed May 21, 1969
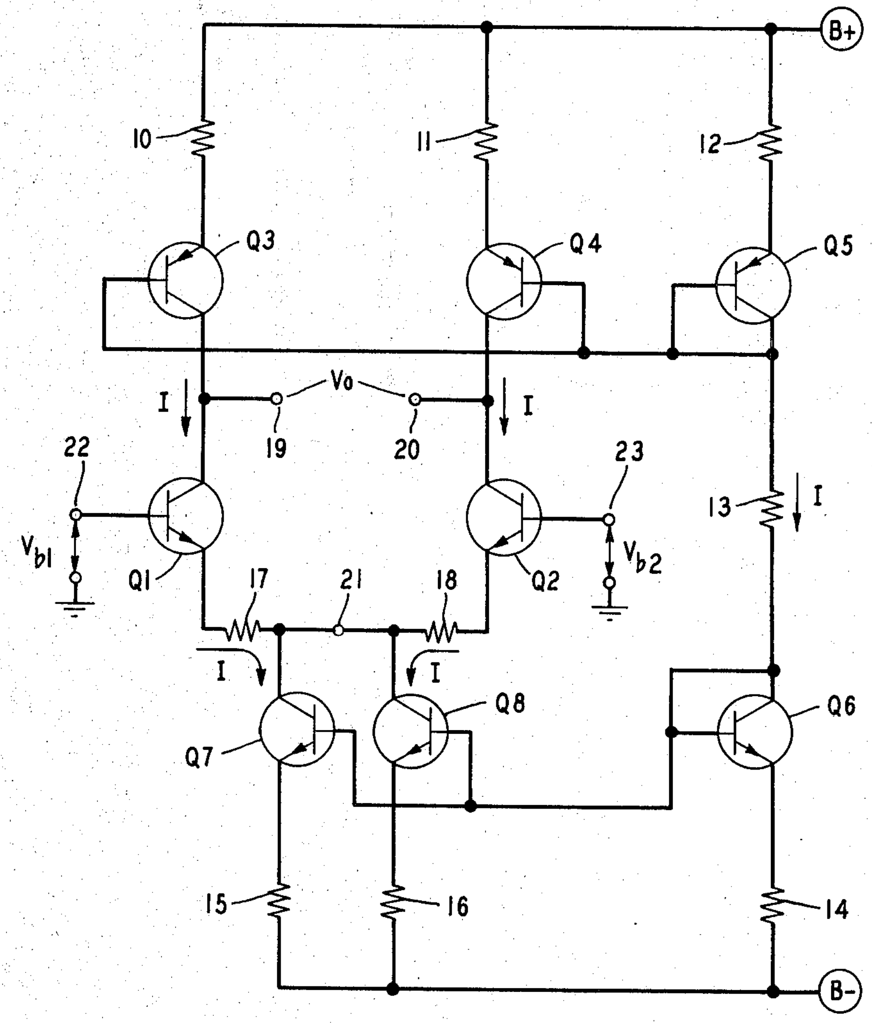
INVENTOR
T. N. RAO
BY
ATTORNEY

United States Patent Office 3,564,439
Patented Feb. 16, 1971

3,564,439

DIFFERENTIAL AMPLIFIER

Tadikonda N. Rao, Plainfield, N.J., assignor to Bell Telephone Laboratories, Incorporated, Murray Hill and Berkeley Heights, N.J.

Filed May 21, 1969, Ser. No. 826,424
Int. Cl. H03f *3/68*
U.S. Cl. 330—30 7 Claims

ABSTRACT OF THE DISCLOSURE

A differential amplifier utilizes matched transistor current sources in both the emitter and collector circuits of the differential pair in order to achieve high common mode rejection and differential gain without sacrificing the differential output.

BACKGROUND OF THE INVENTION (1) Field of the invention

This invention relates to amplifier circuits and, more particularly, to differential amplifier circuits utilizing current sources to achieve high common mode rejection and differential gain.

(2) Description of the prior art

In order to achieve high common mode rejection and high differential gain in a differential amplifier without the use of high value resistors and D-C supply voltages, current sources are typically utilized in both the emitter and collector circuits of the differential pair. The current source in the emitter circuit supplies the emitter currents for the transistors of the differential pair and gives high common mode rejection. The current sources in the collector circuits replace the large collector load resistors which would otherwise be required and give high differential gain. It is extremely difficult to achieve a high degree of matching of the current sources and still obtain a differential output from the amplifier. This is especially true in integrated circuits where all the components are fixed during the manufacturing process. Consequently, the differential output is usually sacrificed in order to obtain the required degree of matching of the current sources.

In many applications such as in differential voltage to differential current converters used in some gyrator circuits, a differential output is very desirable. Thus, the biasing scheme described previously is not adequate. Also, the increasing use of integrated circuits creates a need for differential amplifiers compatible with other integrated circuits.

Accordingly, it is an object of this invention to improve the common mode rejection and differential gain of differential amplifier circuits without sacrificing the differential output.

Another object is to simplify differential amplifier circuits in order to be more amenable to integrated circuit techniques.

SUMMARY OF THE INVENTION

The foregoing objects and others are achieved in accordance with the principles of the invention by a differential amplifier which utilizes matched current sources in both the emitter and collector circuits of the differential pair. The collector load resistors of the transistors of the differential pair are replaced by current sources derived from matched transistors. The collectors of the transistors in the current sources are connected to the collectors of the transistors of the differential pair. A current source is also placed in the emitter circuit of the differential pair. The transistors in the various current sources are biased in such a way that the collector current of every transistor in the amplifier circuit is substantially the same value. Thus the amplifier is symmetrical and a differential output may be obtained simultaneously with the increased common mode rejection and differential gain obtained from using current sources.

BRIEF DESCRIPTION OF THE DRAWINGS

A more complete understanding of the present invention and the objects and features thereof may be gained from the following detailed description and accompanying drawing in which the single figure is a schematic circuit diagram of the differential amplifier of this invention.

DETAILED DESCRIPTION

The illustrative embodiment of the differential amplifier of this invention shows transistors Q1 and Q2 differentially connected and forming the basic differential pair. The input voltages $V_{b1}$ and $V_{b2}$ are applied to input terminals 22 and 23, respectively, and thereby connected to the base terminals of transistors Q1 and Q2, respectively. The output voltage $V_0$ is taken from terminals 19 and 20 which are directly connected to the collector terminals of transistors Q1 and Q2, respectively. If the differential pair is balanced or symmetrical, the output voltage $V_0$ will be zero when the input voltages $V_{b1}$ and $V_{b2}$ are equal.

The collector terminal of transistor Q1 is returned to a voltage source B+ through a transistor Q3 and a resistor 10. Likewise the collector of transistor Q2 is returned to source B+ through a transistor Q4 and a resistor 11. Transistors Q3 and Q4 are essentially current sources, thus the collector terminals of transistors Q1 and Q2 see a desired high impedance toward the source B+. The emitter terminals of transistors Q1 and Q2 are connected to a common terminal 21 through resistors 17 and 18, respectively. Terminal 21 is tied to a second source B− through a network comprising the series combination of a transistor Q7 and a resistor 15 in parallel with the series combination of a transistor Q8 and a resistor 16. A bias network comprising the transistors Q5 and Q6 and the resistors 12, 13 and 14 is connected between the two sources B+ and B−. The base terminal of transistor Q5 is tied to the collector terminal and is also connected to the base terminals of transistors Q3 and Q4. Likewise the base terminal of transistor Q6 is tied to its collector terminal and is connected to the base terminals of transistors Q7 and Q8.

Transistors Q3, Q4 and Q5 are the same type of transistor, being PNP type in the illustrative embodiment. The characteristics of these transistors Q3, Q4 and Q5 should be matched as closely as possible. Likewise the transistors Q6, Q7 and Q8 are of the same type, being NPN types in the illustrative embodiment, and should have matched characteristics. The transistors Q1 and Q2 of the differential pair should have matched characteristics. The characteristics of transistors Q1 and Q2 might also advantageously, but not necessarily, match the characteristics of transistors Q6, Q7 and Q8 since all are the same NPN type in the illustrative embodiment. Extremely close matching of the transistor characteristics may advantageously be obtained by using integrated circuits. It is to be understood that transistor types may be interchanged as desired.

The base currents of the transistors are negligible in comparison with the emitter or collector currents, which are approximately equal. Thus the current I through resistor 13, i.e., the current in the collector leads of both transistor Q5 and Q6, essentially equals the current through resistors 12 and 14. For specified values for resistors 12 and 14, the current I is dependent upon resistor 13 for a given type of transistor Q5 and Q6. The base terminals of transistors Q3 and Q4 are at the same potential as the base terminal of transistor Q5. Thus with resistors 10 and 11 equal to resistor 12, the collector current in each transistor Q3 and Q4 equals the collector current I in Q5 as all three transistors have matched characteristics and are identically biased. The collector curent I in each transistor Q3 and Q4 is also the collector current of transistor Q1 and Q2, respectively.

If resistors 14, 15 and 16 have equal values, the collector current in each transistor Q7 and Q8 must equal the collector current I in Q6 since the transistors have matched characteristics and are identically biased. Resistors 14, 15 and 16 may advantageously have the same value as resistors 10, 11 and 12. The collector currents in transistors Q7 and Q8 areequal to the currents from the emitters of transistors Q1 and Q2. Thus the emitter currents of Q1 and Q2 are also equal to current I and are thus matched with the collector currents of Q1 and Q2, respectively. Each transistor in the entire amplifier circuit has the same collector current. The amplifier is symmetrical with respect to the transistors Q1 and Q2 of the differential pair. Thus output terminals 19 and 20 see identical driving circuits looking back into the amplifier and a differential output may be obtained. The current sources formed by transistors Q3, Q4, Q7 and Q8 replace the large resistors which would otherwise be required to get high common mode rejection and high differential gain. Resistors 17 and 18 may be chosen to optimize the input impedance, differential gain and the bandwidth of the amplifier. Thus the amplifier gives a differential output simultaneous with increased common mode rejection and improved differential gain.

Transistors Q7 and Q8 may be combined into one transistor, if desired, by making the emitter area of the new transistor twice the area of transistor Q7 and the emitter resistor one-half the value of resistor 15. Such a new transistor would then have a collector current of 2I which would match the emitter currents from transistors Q1 and Q2 combining at terminal 21.

The amplifier circuit is very amenable to integrated circuit techniques because only transistors and resistors are used and the characteristics of many of the components are matched.

It is to be understood that the embodiment described herein is merely illustrative of the principles of the invention. Modifications thereto may be made by those skilled in the art without departing from the spirit and scope of the invention.

What is claimed is:

1. A differential amplifier comprising, in combination, first and second transistors differentially connected for receiving an input signal between the base terminals thereof;

said transistors having matched characteristics;

a pair of output terminals connected to the collector terminals of said first and second transistors;

means for connecting the emitter terminals of said first and second transistors to a common terminal;

third and fourth transistors having the collector terminals thereof connected to the collector terminals of said first and second transistors, respectively, and having the emitter terminals thereof connected to a first reference source;

a fifth transistor having the collector terminal thereof connected to said common terminal and having the emitter terminal thereof connected to a second refence source;

a bias circuit connected between said first and second reference sources and including seventh and eighth transistors and a control resistor;

said seventh transistor having the base terminal thereof connected to the base terminals of said third and fourth transistors and having the emitter terminal thereof connected to said first reference source;

said eighth transistor having the base terminal thereof connected to the base terminal of said fifth transistor and the emitter terminal thereof connected to said second reference source;

said control resistor being connected between the collector terminals of said seventh and eighth transistors for controlling the collector currents thereof;

said third, fourth, and seventh transistors having matched characteristics; and said fifth and eighth transistors having matched characteristics, whereby the collector currents of said first and second transistors equal the collector currents of said third and fourth transistors, respectively, for any value of said resistor.

2. Apparatus in accordance with claim 1 including a sixth transistor; said sixth transistor having the collector, emitter, and base terminals thereof connected to said common terminal, said second reference source, and said base terminal of said eighth transistor, respectively, and having characteristics matched with said characteristics of said fifth and eighth transistors.

3. Apparatus in accordance with claim 2 wherein said first and second transistors have characteristics matched with said characteristics of said fifth, sixth, and eighth transistors.

4. Apparatus in accordance with claim 2 including first, second, and third resistors having equal values connected between said emitter terminals of said third, fourth, and seventh transistors, respectively, and said first reference source;

fourth, fifth, and sixth resistors having equal values connected between said emitter terminals of said fifth, sixth, and eighth transistors, respectively, and said second reference source; and wherein said first, second, fifth, sixth, and eighth transistors and said third, fourth, and seventh transistors have equal emitter areas, respectively, whereby said amplifier is symmetrical with respect to said output terminals.

5. An amplifier in accordance with claim 2 wherein said third, fourth, and seventh transistors are complementary types relative to said first, second, fifth, sixth, and eighth transistors.

6. An amplifier in accordance with claim 5 wherein said first, second, fifth, sixth, and eighth transistors are NPN type and said third, fourth, and seventh transistors are PNP type.

7. Apparatus in accordance with claim 2 including a pair of matched resistors connected between the emitter terminals of said first and second transistors and said common terminal for optimizing the input impedance, differential gain, and bandwidth of said amplifier.

References Cited

UNITED STATES PATENTS

| | | | |
|---|---|---|---|
| 3,440,554 | 4/1969 | McGraw et al. | 330—30X |
| 3,467,908 | 9/1969 | Burwen | 330—30X |

ROY LAKE, Primary Examiner

L. J. DAHL, Assistant Examiner

U.S. Cl. X.R.

330—32, 38